US009293399B2

(12) United States Patent
Fujii et al.

(10) Patent No.: US 9,293,399 B2
(45) Date of Patent: Mar. 22, 2016

(54) SEMICONDUCTOR DEVICE AND ELECTRONIC UNIT PROVIDED WITH THE SAME

(71) Applicant: ROHM CO., LTD., Kyoto-shi, Kyoto (JP)

(72) Inventors: Kenji Fujii, Kyoto (JP); Mamoru Yamagami, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/497,722

(22) Filed: Sep. 26, 2014

(65) Prior Publication Data
US 2015/0091143 A1    Apr. 2, 2015

(30) Foreign Application Priority Data

Sep. 27, 2013 (JP) ................. 2013-201476

(51) Int. Cl.
H01L 23/495 (2006.01)
H01L 23/00 (2006.01)
(Continued)

(52) U.S. Cl.
CPC .... *H01L 23/49575* (2013.01); *H01L 23/49548* (2013.01); *H01L 23/49555* (2013.01); *H01L 23/49816* (2013.01); *H01L 23/49827* (2013.01); *H01L 24/48* (2013.01); *H01L 25/0657* (2013.01); *H01L 23/3107* (2013.01); *H01L 24/06* (2013.01); *H01L 24/16* (2013.01); *H01L 24/32* (2013.01); *H01L 24/45* (2013.01); *H01L 24/73* (2013.01); *H01L 2224/0401* (2013.01); *H01L 2224/04042* (2013.01); *H01L 2224/05644* (2013.01); *H01L 2224/06135* (2013.01); *H01L 2224/16225* (2013.01); *H01L 2224/16235* (2013.01); *H01L 2224/16245* (2013.01); *H01L 2224/32145* (2013.01); *H01L 2224/45124* (2013.01); *H01L 2224/45144* (2013.01);
(Continued)

(58) Field of Classification Search
CPC ........... G01L 2224/48247; G01L 2224/32245; G01L 2224/32145; G01L 2224/97; G01L 23/49575; G01L 25/0657
See application file for complete search history.

(56) References Cited

U.S. PATENT DOCUMENTS 6,858,920 B2    2/2005 Hatauchi
6,995,459 B2 *  2/2006 Lee et al. ............. 257/676
(Continued)

FOREIGN PATENT DOCUMENTS

JP    2004-119684    4/2004

*Primary Examiner* — Roy Potter
(74) *Attorney, Agent, or Firm* — Hamre, Schumann, Mueller & Larson, P.C.

(57) ABSTRACT

A semiconductor device includes first and semiconductor elements, an electroconductive support member including electroconductive elements, and a resin package. The first semiconductor element includes a first active surface and first electrodes formed on the first active surface. The second semiconductor element includes a second active surface and second electrodes formed on the second active surface. The electroconductive support member is electrically connected to the first and second semiconductor elements and support these elements. The resin package covers the first and second semiconductor elements. The second semiconductor element is located between the first semiconductor element and the electroconductive support member. The first electrodes of the first semiconductor element and the electroconductive elements are connected by wire. An electroconductive bonding material is also provided that bonds the second electrodes of the second semiconductor element and the electroconductive elements to which the wire is bonded.

16 Claims, 9 Drawing Sheets

(51) Int. Cl.
*H01L 23/498* (2006.01)
*H01L 25/065* (2006.01)
*H01L 23/31* (2006.01)

(52) U.S. Cl.
CPC ............... *H01L2224/48091* (2013.01); *H01L 2224/48235* (2013.01); *H01L 2224/48247* (2013.01); *H01L 2224/73253* (2013.01); *H01L 2224/73265* (2013.01); *H01L 2225/0651* (2013.01); *H01L 2225/06517* (2013.01); *H01L 2225/06558* (2013.01); *H01L 2924/00014* (2013.01); *H01L 2924/10253* (2013.01); *H01L 2924/15192* (2013.01); *H01L 2924/15311* (2013.01)

(56) References Cited

U.S. PATENT DOCUMENTS

| 7,732,899 | B1 * | 6/2010 | Berry et al. | 257/666 |
| 7,830,020 | B2 * | 11/2010 | Dahilig et al. | 257/777 |
| 2008/0079130 | A1 * | 4/2008 | Ha et al. | 257/680 |

* cited by examiner

SEMICONDUCTOR DEVICE AND ELECTRONIC UNIT PROVIDED WITH THE SAME

BACKGROUND OF THE INVENTION

1. Field of the Invention

The present invention relates to a semiconductor device and an electronic unit.

2. Description of the Related Art

A semiconductor device having a plurality of semiconductor elements arranged one on top of another has conventionally been proposed. For instance, the semiconductor device disclosed in JP-A-2004-119684 includes a first semiconductor element mounted on a substrate, and a second semiconductor element mounted on the first semiconductor element. The second semiconductor element is smaller in dimensions than the first semiconductor element. Each of the first semiconductor element and the second semiconductor element has a principal surface on which a plurality of electrodes are formed. Each of the electrodes of the second semiconductor element is electrically connected to the substrate or one of the electrodes of the first semiconductor element via a wire.

The above-described conventional semiconductor device allows only a relatively low current to flow, because usable wires are limited in terms of their materials or thicknesses. Moreover, in the conventional structure, the arrangement of the wires may become complicated when the first semiconductor element and the second semiconductor element are electrically connected to each other by wires. Further, the principal surface of the first semiconductor element and the principal surface of the second semiconductor element are spaced apart from each other only by a distance approximately corresponding to the thickness of the second semiconductor element. This causes the function of the first semiconductor element and the function of the second semiconductor element to interfere with each other, which may hinder the function of each element from being properly exerted.

SUMMARY OF THE INVENTION

The present invention has been conceived under the above-described circumstances. It is therefore an object of the present invention to provide a semiconductor device configured to ensure proper electrical connection between a plurality of semiconductor elements.

The semiconductor device provided according to a first embodiment of the present invention is provided with a first semiconductor element including a first active surface and a plurality of first electrodes formed on the first active surface; a second semiconductor element including a second active surface and a plurality of second electrodes formed on the second active surface; an electroconductive support member electrically connected to the first semiconductor element and the second semiconductor element while supporting the first semiconductor element and the second semiconductor element, the electroconductive support member including a plurality of electroconductive elements; and a resin package covering the first semiconductor element and the second semiconductor element. The second semiconductor element is located between the first semiconductor element and the electroconductive support member. The semiconductor device is further provided with a wire connected to the first electrode of the first semiconductor element and the electroconductive element, and an electroconductive bonding material that bonds the second electrode of the second semiconductor element and the electroconductive element to which the wire is bonded.

Preferably, the electroconductive support member includes at least one electroconductive element to which the wire is connected and the electroconductive bonding material is bonded but which is not connected to an external object.

Preferably, the first active surface of the first semiconductor element faces away from the electroconductive support member, and the second active surface of the second semiconductor element faces toward the electroconductive support member.

Preferably, the electroconductive support member includes, as the electroconductive elements, a plurality of leads made of metal.

Preferably, the resin package is rectangular as viewed in plan, and the leads extend inward from each of four sides of the resin package.

Preferably, the lead is flat on a side closer to the second semiconductor element, and a portion of the lead at which the electroconductive bonding material is bonded is covered with the resin package on opposite sides in the thickness direction.

Preferably, a portion of the lead at which the wire is bonded is exposed from the resin package on a side opposite from the second semiconductor element in the thickness direction.

Preferably, the lead has a stepped portion on a side opposite from the second semiconductor element to provide a mount surface exposed from the resin package on the side opposite from the second semiconductor element.

Preferably, the lead has a uniform thickness and a portion of the lead at which the electroconductive bonding material is bonded is covered with the resin package on opposite sides in the thickness direction.

Preferably, a portion of the lead at which the wire is bonded is covered with the resin package on opposite sides in the thickness direction.

Preferably, the lead includes a projection projecting laterally from the resin package.

Preferably, the lead is formed with a bent at the projection to provide a mount surface.

Preferably, at least one of the leads, to which the wire and the electroconductive bonding material is bonded, is covered with the resin package throughout the length on opposite sides in the thickness direction and includes an end surface that is exposed from the resin package and flush with a side surface of the resin package.

Preferably, as viewed in plan, at least one of the second electrodes is located outside the first semiconductor element.

Preferably, as viewed in plan, all of the second electrodes are located outside the first semiconductor element.

Preferably, the electroconductive support member is provided with: a base made of an insulating material and including a principal surface closer to the second semiconductor element and a reverse surface facing away from the principal surface; a principal-side plating layer formed on the principal surface and constituting the electroconductive element; a reverse-side plating layer formed on the reverse surface and constituting the electroconductive element; and a through-hole conductor constituting the electroconductive element and electrically connecting at least a part of the principal-side plating layer and at least a part of the reverse-side plating layer to each other. The electroconductive support member includes a plurality of principal-side electrodes provided by a part of the principal-side plating layer and a plurality of reverse-side electrodes provided by a part of the reverse-side plating layer. The wire and the electroconductive bonding material are bonded to a selected one or ones of the principal-side electrodes.

Preferably, the principal-side plating layer includes an isolated element which is electrically connected to at least one said wire and at least one said electroconductive element but is not electrically connected to any of the reverse-side electrodes.

Preferably, the first semiconductor element and the second semiconductor element are bonded to each other by an insulating bonding material.

Preferably, as viewed in plan, the first semiconductor element is smaller than the second semiconductor element.

Preferably, as viewed in plan, the first semiconductor element and the second semiconductor element have the same size.

An electronic unit provided according to a second aspect of the present invention includes a circuit board including a wiring pattern, and a semiconductor device provided according to the first aspect of the present invention and mounted on the circuit board. At least one of the electroconductive elements is electrically connected to the wire and the electroconductive bonding material and insulated from the wiring pattern of the circuit board.

According to the above-described arrangement, the first electrodes of the first semiconductor element and the second electrodes of the second semiconductor element are electrically connected to each other via wires, electroconductive elements and electroconductive bonding materials. The electroconductive bonding materials overlap the second semiconductor element as viewed in plan and do not increase the dimensions of the semiconductor device as viewed in plan. The wires provide proper electrical connection between the leads and the first semiconductor element on the second semiconductor element. The use of the electroconductive bonding materials allows a larger quantity of current to flow as compared with the conventional structure that uses wires alone. In this way, while the first semiconductor element and the second semiconductor element are electrically connected to each other properly, size reduction of the semiconductor device and increase of the quantity of current that can flow through the device are realized.

Other features and advantages of the present invention will become more apparent from the detailed description given below with reference to the accompanying drawings.

DESCRIPTION OF THE PREFERRED EMBODIMENTS

Preferred embodiments of the present invention are described below with reference to the accompanying drawings.

Figure 1:
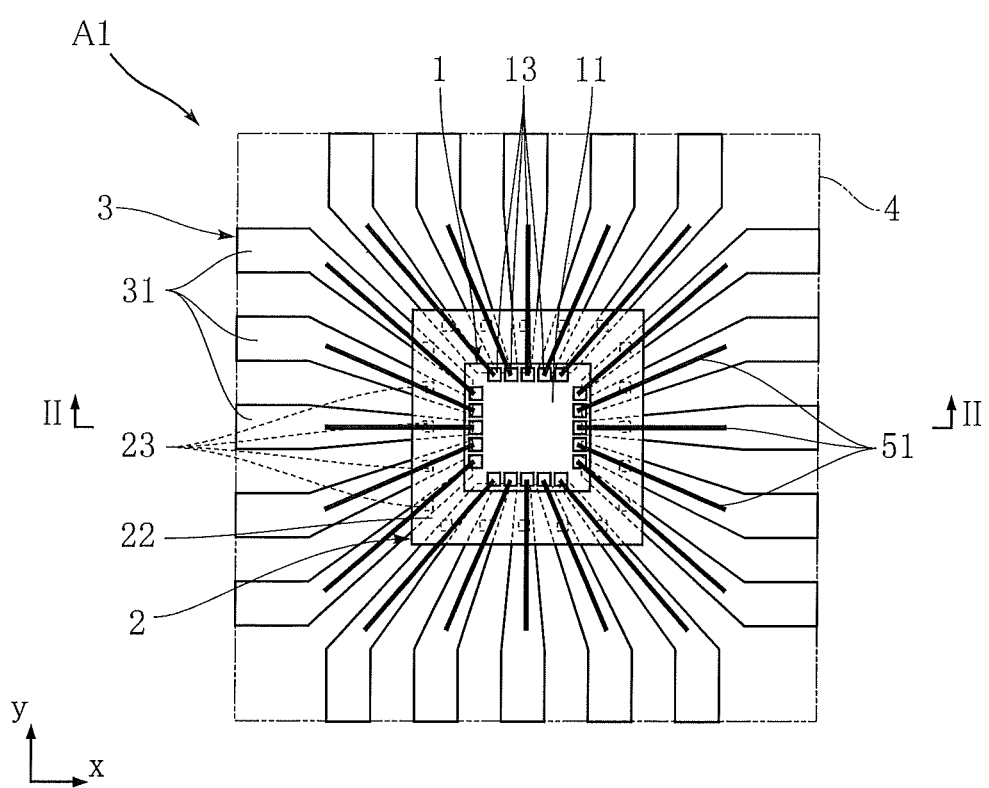
FIG. 1 is a plan view of a semiconductor device according to a first embodiment.
Figure 2:
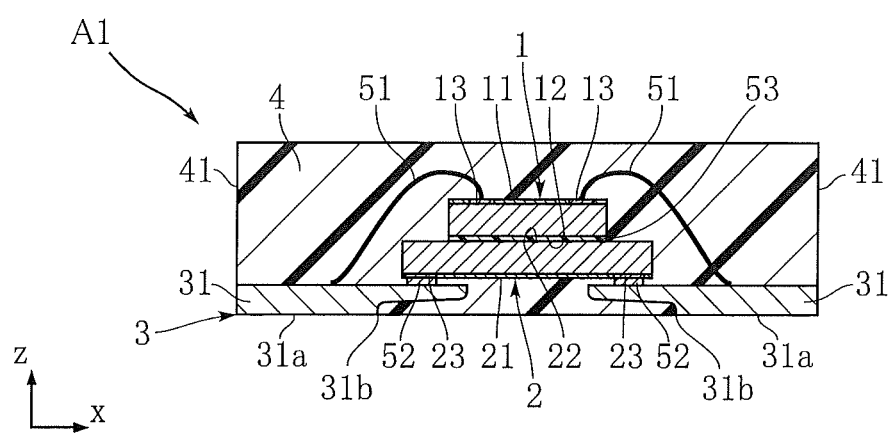
FIG. 2 is a sectional view taken along lines II-II in FIG. 1.
Figure 3:
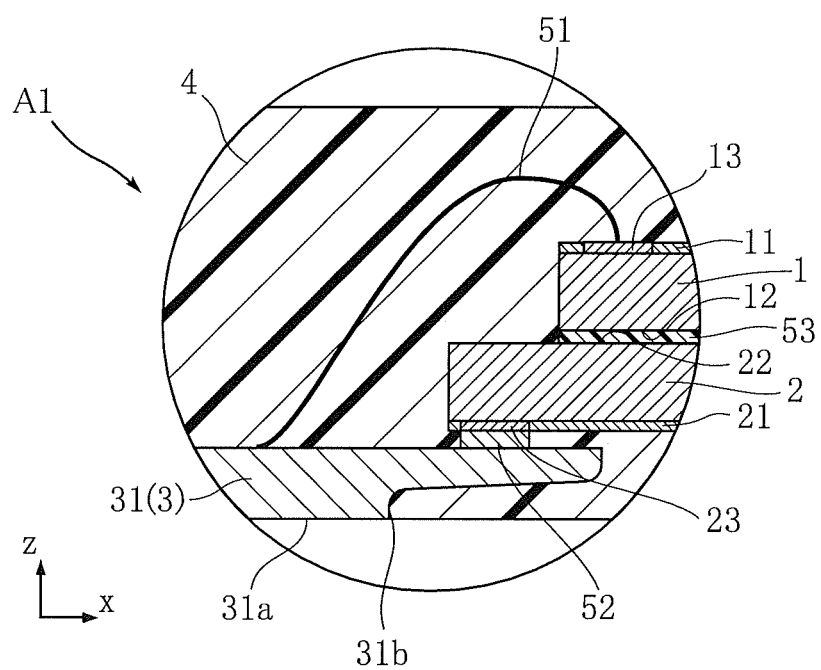
FIG. 3 is an enlarged sectional view of a part of the semiconductor device of FIG. 1.

FIGS. 1-3 show a semiconductor device according to a first embodiment. The semiconductor device A1 of this embodiment includes a first semiconductor element 1, a second semiconductor element 2, an electroconductive support member 3 and a resin package 4.

FIG. 1 shows a principal part of the semiconductor device A1. FIG. 2 is a sectional view taken along lines II-II in FIG. 1. FIG. 3 is an enlarged sectional view of apart of the structure shown in FIG. 2. In FIG. 1, the resin package 4 is illustrated by phantom lines.

The first semiconductor element 1 is a functional element that performs at least a part of the function of the semiconductor device A1 and is made of e.g. Si. The first semiconductor element 1 has a first active surface 11 and a reverse surface 12. The first semiconductor element 1 is provided with a plurality of first electrodes 13. In this embodiment, the first semiconductor element 1 is rectangular as viewed in plan.

A functional circuit for achieving the function of the first semiconductor element 1 is formed in the first active surface 11. For easier understanding, it is supposed that the first active surface 11 is a region having a certain thickness as shown in FIGS. 2 and 3. In FIGS. 2 and 3, the first active surface 11 faces upward in the direction z (hereinafter simply referred to as "upward"). The reverse surface 12 faces in the opposite direction from the first active surface 11, i.e., faces downward in the direction z (hereinafter simply referred to as "downward").

The first electrodes 13 are formed in the first active surface 11. Each of the first electrodes 13 includes e.g. a part of an Au layer exposed from an insulating layer (not shown) or such a part of an Au layer on which a metal layer is formed. In this embodiment, the first electrodes 13 are arranged along the four sides of the first semiconductor element 1.

The second semiconductor element 2 is a functional element that performs at least a part of the function of the semiconductor device A1 and is made of e.g. Si. The second semiconductor element 2 has a second active surface 21 and a reverse surface 22. The second semiconductor element 2 is provided with a plurality of second electrodes 23. In this embodiment, the second semiconductor element 2 is rectangular as viewed in plan.

A functional circuit for achieving the function of the second semiconductor element 2 is formed in the second active surface 21. For easier understanding, it is supposed that the second active surface 21 is a region having a certain thickness as shown in FIGS. 2 and 3. In FIGS. 2 and 3, the second active surface 21 faces downward. The reverse surface 22 faces in the opposite direction from the second active surface 21, i.e., faces upward in the direction z.

The second electrodes 23 are formed in the second active surface 21. Each of the second electrodes 23 includes e.g. a part of an Au layer exposed from an insulating layer (not shown) or such a part of an Au layer on which a metal layer is formed. In this embodiment, the second electrodes 23 are arranged along the four sides of the second semiconductor element 2.

The first semiconductor element 1 is mounted on the second semiconductor element 2. In the direction z, the second semiconductor element 2 is positioned between the first semiconductor element 1 and the electroconductive support member 3. The first semiconductor element 1 and the second semiconductor element 2 are bonded to each other by using an insulating bonding material 53. More specifically, the reverse surface 12 of the first semiconductor element 1 and the surface 22 of the second semiconductor element 2 are bonded to each other by the insulating bonding material 53. For instance, the insulating bonding material 53 may be an insulating die attach film or insulating paste. With this arrangement, the first active surface 11 of the first semiconductor element 1 and the second active surface 21 of the second semiconductor element 2 face in mutually opposite directions. In this embodiment, the first semiconductor element 1 is smaller than the second semiconductor element 2 in dimensions as viewed in plan, so that the entirety of the first semiconductor element 1 overlaps a part of the second semiconductor element 2 as viewed in plan. In other words, the entirety of the first semiconductor element 1 is contained in the second semiconductor element 2. In this embodiment, the second electrodes 23 are arranged outside the first semiconductor element 1 as viewed in plan.

The electroconductive support member 3 supports the first semiconductor element 1 and the second semiconductor element 2 directly or indirectly and also constitutes a conduction path to the first semiconductor element 1 and the second semiconductor element 2. In this embodiment, the electroconductive support member 3 includes a plurality of electroconductive elements or leads 31. The leads 31 can be made from various materials. Examples of such a material include a Cu-based material (such as Cu—Fe—P) and a Fe-based material (such as Fe-42% Ni). In this embodiment, the upper surface (the surface closer to the second semiconductor element 2) of each lead 31 is flat (see FIG. 2). As shown in FIG. 1, in this embodiment, five leads 31 are arranged at each side of the semiconductor device A1. Thus, a total of twenty leads 31 are provided in the semiconductor device A1.

Each of the leads 31 extends generally from the outer side of the second semiconductor element 2 toward the center of the first semiconductor element 1 (and hence the center of the second semiconductor element). As viewed in plan, the front end of each lead 31 overlaps at least the second semiconductor element 2. In this embodiment, as viewed in plan, the front end of each lead 31 overlaps the first semiconductor element 1 as well.

Each lead 31 has a stepped portion 31b (See FIGS. 2 and 3). The stepped portion 31b is provided on the lower side of each lead 31 (i.e., on the opposite side of the second semiconductor element 2). The portion of the lead 31 which is closer to the front end than the stepped portion 31b is covered with the resin package 4 on its opposite sides in the thickness direction (the direction z). On the other hand, the portion of the lead 31 which is closer to the root than the stepped portion 31b is (i.e., outer portion) is exposed from resin package 4 on its lower surface. The exposed portion provides a mount surface 31a.

The mount surface 31a is used for mounting the semiconductor device A1 on e.g. a circuit board.

The first electrodes 13 of the first semiconductor element 1 are connected to the leads 31 by wires 51, respectively. As shown in FIGS. 2 and 3, the wires 51 extend from the first electrodes 13 to the leads 31 so as to straddle an edge of the second semiconductor element 2. Each wire 51 is bonded to a corresponding lead 31 at a portion opposite from the mount surface 31a in the direction z. That is, each lead 31 has a portion to which a wire 51 is bonded, and the underside of this portion is exposed from the resin package 4. The wires 51 can be made from various materials. Examples of such a material include Au and Al.

The second electrodes 23 of the second semiconductor element 2 are connected to the leads 31 via electroconductive bonding materials 52, respectively. The electroconductive bonding materials 52 are e.g. solder and are sandwiched between the second electrodes 23 of the semiconductor element 2 and the leads 31' to electrically connect the electrodes and the leads to each other. In this embodiment, each lead 31 has a portion the underside of which is covered with the resin package 4, and the electroconductive bonding material 52 is provided at this portion.

As shown in FIG. 3, one of the first electrodes 13 of the first semiconductor element 1 and a corresponding one of the second electrodes 23 of the second semiconductor element 2 are electrically connected to each other by the wire 51, the lead 31 and the electroconductive bonding material 52. As will be understood from FIG. 1, this electrical connection structure is provided for every first electrode 13 (and hence every second electrode 23). Unlike this, only some of the leads 31 may be configured to electrically connect the first electrode 13 and the second electrode 23 to each other.

The resin package 4 entirely covers the first semiconductor element 1, the second semiconductor element 2 and the wires 51 for protection. The resin package 4 also covers at least a part of each lead 31, holds the leads at appropriate positions, and provide insulation between the leads. For instance, the resin package 4 is made of black epoxy resin. In this embodiment, the resin package 4 is rectangular as viewed in plan and has four side surfaces 41.

Figure 4:
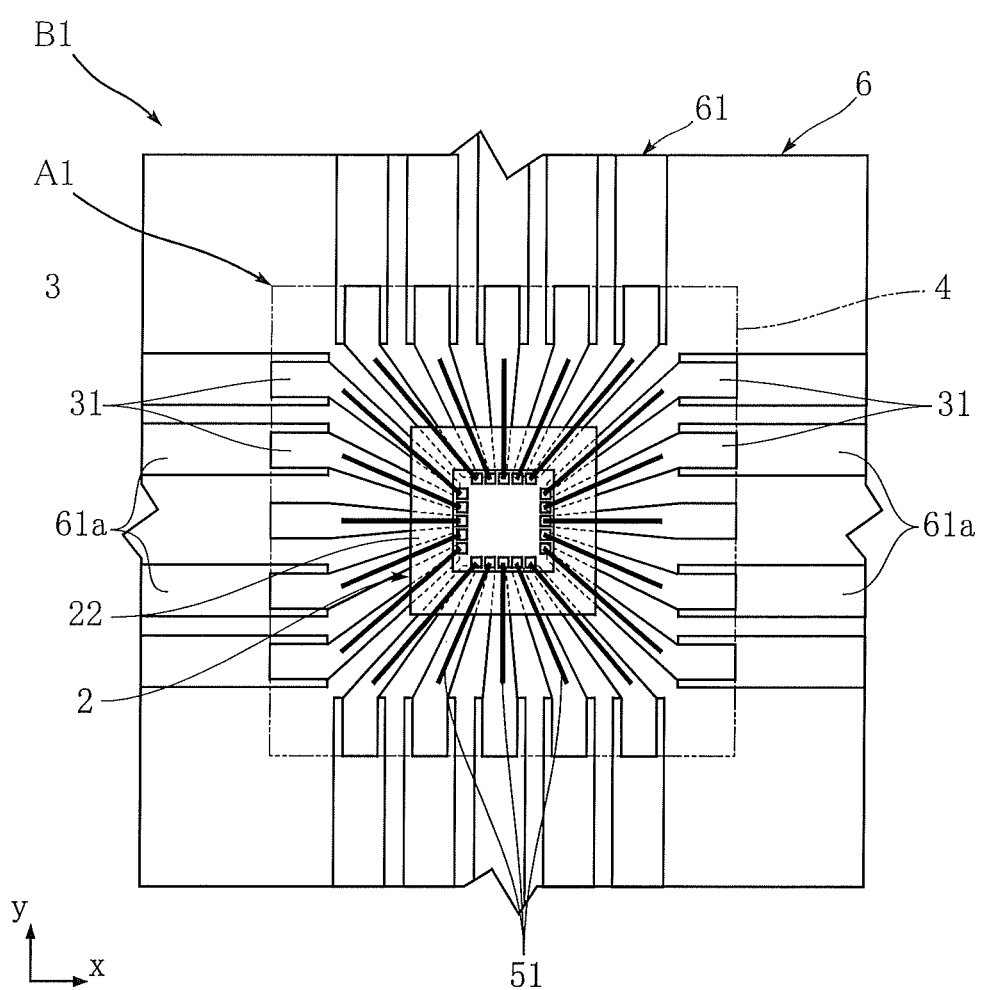
FIG. 4 is a plan view of an example of an electronic unit that uses the semiconductor device of FIG. 1.

FIG. 4 shows an example of an electronic unit that uses the semiconductor device A1. The electronic unit B1 illustrated in the figure includes the semiconductor device A1 and a circuit board 6. In this figure, the resin package 4 is illustrated by phantom lines for easier understanding.

The circuit board 6 includes a substrate made of e.g. glass epoxy resin and a wiring pattern 61 formed on the substrate. For instance, the wiring pattern 61 is made of a Cu plating layer or an Au plating layer. The wiring pattern 61 has a plurality of pads 61a. Each pad 61a is bonded to one of the mount surfaces 31a of the semiconductor device A1 via e.g. solder. As illustrated in the figure, some of the leads 31 may not be connected to the wiring pattern 61. In the example shown in FIG. 4, the two central leads 31 spaced apart from each other in the lateral direction are not connected to any of the pads 61a of the wiring pattern 61. Each of the other leads 31 overlaps one of the pad 61a as viewed in plan and its mount surface 31a is bonded to the pad 61a via solder.

The two leads 31 which are not electrically connected to the wiring pattern 61 merely connect, along with the wires 51 and the electroconductive bonding materials 52, the first electrodes 13 of the first semiconductor element 1 and the second electrodes 23 of the second semiconductor element 2. That is, these two leads 31 do not constitute a conduction path to the exterior of the semiconductor device A1.

The advantages of the semiconductor device A1 and the electronic unit B1 are described below.

In the above-described structure, the first electrodes 13 of the first semiconductor element 1 and the second electrodes 23 of the second semiconductor element 2 are electrically connected to each other via the wires 51, the leads 31 and the electroconductive bonding materials 52. The electroconductive bonding materials 52 overlap the second semiconductor element 2 as viewed in plan and therefore do not increase the dimensions of the semiconductor device A1 as viewed in plan. The wires 51 provide proper electrical connection between the first semiconductor element 1 arranged on the second semiconductor element 2 and the leads 31. The use of the electroconductive bonding materials 52 allows a larger quantity of current to flow than in the structure that uses the wire 51 alone. In this way, while the first semiconductor element and the second semiconductor element are electrically connected to each other properly, size reduction of the semiconductor device and increase of the quantity of current that can flow through the device are realized. The use of the electroconductive bonding materials 52 does not cause an increase in cost, so that the cost for the semiconductor device A1 can be suppressed.

In particular, as shown in FIG. 4, the leads 31 that are not electrically connected to the pads 61a of the circuit board 6 merely function as a means for electrically connecting the first electrodes 13 and the second electrodes 23 within the semiconductor device A1. These leads, which are not intended to constitute a conduction path with the exterior, can also be made in the same manner as other leads.

The first active surface 11 of the first semiconductor element 1 and the second active surface 21 of the second semiconductor element 2 are spaced apart from each other by a distance approximately corresponding to the total of the thicknesses of the first semiconductor element 1 and the second semiconductor element 2. This arrangement is more effective in preventing the first active surface 11 and the second active surface 21 from influencing each other than the arrangement in which the first active surface 11 and the second active surface 21 are spaced apart from each other by a distance corresponding to the thickness of a single semiconductor element.

The portion of each lead 31 to which the second electrode 23 is bonded by the electroconductive bonding material 52 is covered with the resin package 4 on its opposite sides in the thickness direction. The portion of the lead 31 which is not covered with the resin package 4 constitutes e.g. amount surface 31a and is typically arranged at a position offset toward an outer edge of the semiconductor device A1. This embodiment allows the portion of the lead 31 to which the electroconductive bonding material 52 is bonded to be arranged distant from the mount surface 31a, i.e., distant from an outer edge of the semiconductor device A1, and hence to be reliably arranged at a location overlapping the second semiconductor element 2.

The provision of the stepped portion 31b realizes the formation of the mount surface 31a that is reliably exposed from the resin package 4 at a position offset toward an outer edge of the semiconductor device A1.

FIGS. 5-16 show other embodiments. In these figures, the elements that are identical or similar to those of the foregoing embodiment are designated by the same reference signs as those used for the foregoing embodiment, and the explanation of these elements is omitted appropriately.

Figure 5:
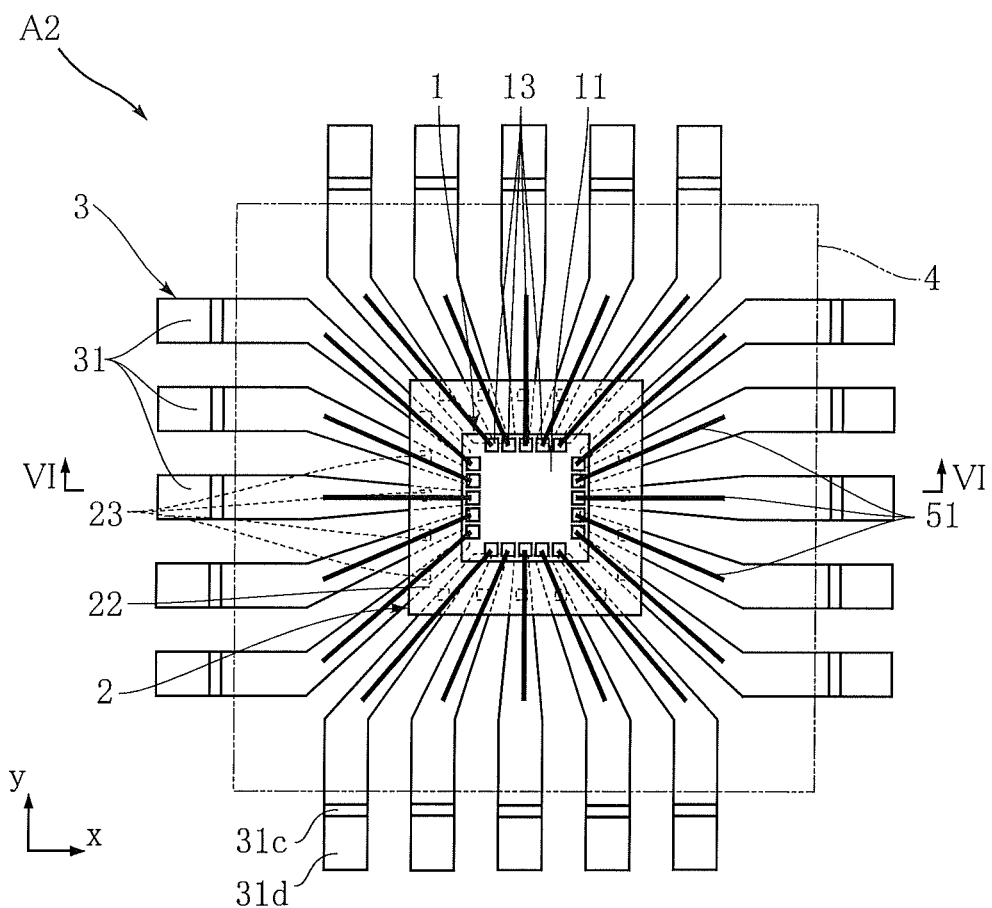
FIG. 5 is plan view of a semiconductor device according to a second embodiment.
Figure 6:
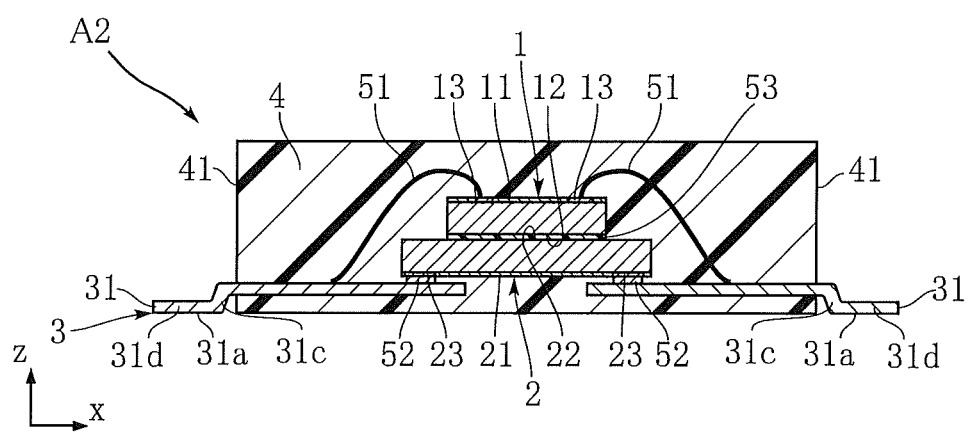
FIG. 6 is a sectional view taken along lines VI-VI in FIG. 5.

FIGS. 5 and 6 show a semiconductor device according to a second embodiment. The semiconductor device A2 of this embodiment includes a first semiconductor element 1, a second semiconductor element 2, an electroconductive support member 3 and a resin package 4.

FIG. 5 is a schematic plan view of the semiconductor device A2. FIG. 6 is a sectional view in a z-x plane, taken along lines VI-VI in FIG. 5. In FIG. 5, the resin package 4 is illustrated by phantom lines for easier understanding.

The first semiconductor element 1 is a functional element that performs at least a part of the function of the semiconductor device A2 and has a first active surface 1, a reverse surface and a plurality of first electrodes 13. The first semiconductor element 1 is made of e.g. Si and is rectangular as viewed in plan in this embodiment.

A functional circuit for achieving the function of the first semiconductor element 1 is formed in the first active surface 11. For easier understanding, it is supposed that the first active surface 11 is a region having a certain thickness as shown in FIG. 6. In FIG. 6, the first active surface 11 faces upward. The reverse surface 12 faces in the opposite direction from the first active surface 11, i.e., faces downward.

The first electrodes 13 are formed in the first active surface 11. Each of the first electrodes 13 includes e.g. a part of an Au layer exposed from an insulating layer (not shown) or such a part of an Au layer on which a metal layer is formed. In this embodiment, the first electrodes 13 are arranged along the four sides of the first semiconductor element 1 that is rectangular.

The second semiconductor element 2 is a functional element that performs at least a part of the function of the semiconductor device A2 and has a second active surface 21, a reverse surface 22 and a plurality of second electrodes 23. In this embodiment, the second semiconductor element 2 is made of e.g. Si and rectangular as viewed in plan in this embodiment.

A functional circuit for achieving the function of the second semiconductor element 2 is formed in the second active surface 21. For easier understanding, it is supposed that the second active surface 21 is a region having a certain thickness as shown in FIG. 6. The second active surface 21 faces downward in FIG. 6. The reverse surface 22 faces in the opposite direction from the second active surface 21, i.e., faces upward.

The second electrodes 23 are formed in the second active surface 21. Each of the second electrodes 23 includes e.g. a part of an Au layer exposed from an insulating layer (not shown) or such a part of an Au layer on which a metal layer is formed. In this embodiment, the second electrodes 23 are arranged along the four sides of the second semiconductor element 2 that is rectangular.

The first semiconductor element 1 is mounted on the second semiconductor element 2. That is, the second semiconductor element 2 is positioned between the first semiconductor element 1 and the electroconductive support member 3 in the direction z. The first semiconductor element 1 and the second semiconductor element 2 are bonded to each other by using an insulating bonding material 53. More specifically, the reverse surface 12 of the first semiconductor element 1 and the second active surface 21 of the second semiconductor element 2 are bonded to each other by using the insulating bonding material 53. For instance, the insulating bonding material 53 may be an insulating die attach film or insulating paste. With this arrangement, the first active surface 11 of the first semiconductor element 1 and the second active surface 21 of the second semiconductor element 2 face in mutually opposite directions. In this embodiment, the first semiconductor element 1 is smaller than the second semiconductor element 2 in dimensions as viewed in plan, and the entirety of the first semiconductor element is contained in the second semiconductor element 2. In this embodiment, the second electrodes 23 are arranged outside the first semiconductor element 1 as viewed in plan.

The electroconductive support member 3 supports the first semiconductor element 1 and the second semiconductor element 2 directly or indirectly, and also constitutes a conduction path to the first semiconductor element 1 and the second semiconductor element 2. In this embodiment, the electroconductive support member 3 includes a plurality of leads 31 as electroconductive elements. The leads 31 can be made from various materials. Examples of such a material include a Cu-based material (such as Cu—Fe—P) and a Fe-based material (such as Fe-42% Ni). In this embodiment, each lead 31 has a uniform thickness. In this embodiment, five leads 31 are arranged at each of the four sides of the semiconductor device A2, so that a total of twenty leads 31 are provided.

Each of the leads 31 extends generally from the outer side of the second semiconductor element 2 toward the center of the first semiconductor element 1 or the second semiconductor element 2. As viewed in plan, the front end of each lead 31 overlaps at least the second semiconductor element 2. In this embodiment, as viewed in plan, the front end of each lead 31 overlaps the first semiconductor element 1 as well, but the present invention is not limited to this arrangement.

Each lead 31 has a projection 31d and a bent 31c. The projections 31d project outward from the side surfaces 41 of the resin package 4. The portions of each lead 31 except the projection 31d are covered with the resin package 4 on opposite sides in the thickness direction. The bent 31c is provided in the projection 31d. With the bent 31c of the lead 31 being a boundary, the inner side of the bent 31c is located at a relatively high position, whereas the outer side of the bent 31c is located at a relatively low position. The lower surface, in the figure, of the portion of the lead 31 which is on the outer side of the bent 31c serves as a mount surface 31a. The mount surface 31a is used for mounting a semiconductor device A2 on e.g. a circuit board.

Figure 16:
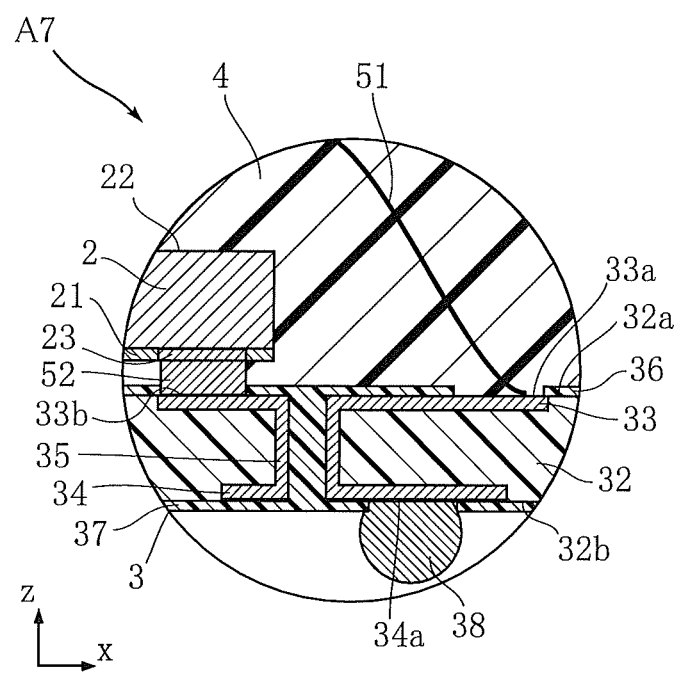
FIG. 16 is an enlarged sectional view of a part of the semiconductor device of FIG. 13.

The first electrodes 13 of the first semiconductor element 1 are connected to the leads 31 by wires 51, respectively. As shown in FIG. 16, the wires 51 extend from the first electrodes 13 to the leads 31 so as to straddle an edge of the second semiconductor element 2. Each wire 51 is bonded to a corresponding lead 31 at a portion opposite from the mount surface 31a in the direction z. In other words, the underside of the portion of each lead 31 to which the wire 51 is bonded is exposed from the resin package 4. The wires 51 can be made from various materials. Examples of such a material include Au and Al.

The second electrodes 23 of the second semiconductor element 2 are connected to the leads 31 via electroconductive bonding materials 52, respectively. The electroconductive bonding materials 52 may be e.g. solder and are sandwiched between the second electrodes 23 of the semiconductor element 2 and the leads 31 to electrically connect the electrodes and the leads to each other. In this embodiment, each lead 31 has a portion the underside of which is covered with the resin package 4, and the electroconductive bonding material 52 is bonded to this portion.

As shown in FIG. 6, the first electrodes 13 of the first semiconductor element 1 and the second electrodes 23 of the second semiconductor element 2 are electrically connected to each other by the wires 51, the leads 31 and the electroconductive bonding materials 52. As shown in FIG. 5, every lead 31 electrically connects one of the first electrodes 13 and one of the second electrodes 23. However, the present invention is not limited to this arrangement, and only some of the leads 31 may be configured to electrically connect the first electrodes 13 and the second electrodes 23 to each other.

The resin package 4 entirely covers the first semiconductor element 1, the second semiconductor element 2 and the wires 51 for protection. The resin package 4 also covers at least a part of each lead 31 to hold the leads at appropriate positions and provide insulation between the leads. For instance, the resin package 4 is made of black epoxy resin. In this embodiment, the resin package 4 is rectangular as viewed in plan and has four side surfaces 41 that forms the rectangle.

Figure 7:
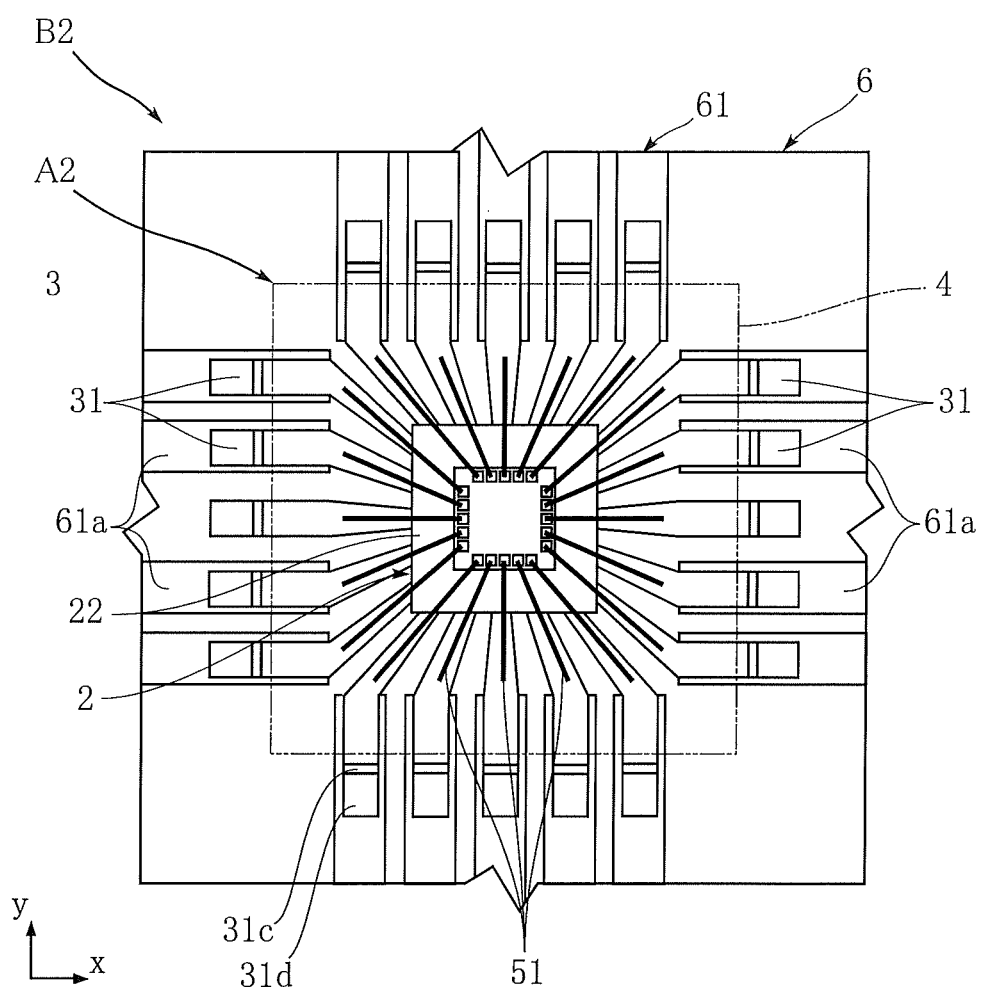
FIG. 7 is a plan view of an example of an electronic unit that uses the semiconductor device of FIG. 5.

FIG. 7 shows an example of an electronic unit that uses the semiconductor device A2. The electronic unit B2 includes the semiconductor device A2 and a circuit board 6. In this figure, the resin package 4 is illustrated by phantom lines for easier understanding.

The circuit board 6 includes a substrate made of e.g. glass epoxy resin and a wiring pattern 61 formed on the substrate. For instance, the wiring pattern 61 is made of a Cu plating layer or an Au plating layer. The wiring pattern 61 has a plurality of pads 61a. The pads 61a are bonded to the mount surfaces 31a of the semiconductor device A2 via e.g. solder (not shown). As illustrated in the figure, except the two leads 31 located at the center in the direction y in the figure, the leads 31 overlap the pads 61a of the wiring pattern 61 as viewed in plan. The mount surfaces 31a of the leads 31 overlapping the pads 61a are bonded to the pads 61a via solder.

The two leads 31 located at the center in the direction y do not overlap the pads 61a and are not electrically connected to the wiring pattern 61. Thus, these two leads 31 do not constitute a conduction path to the exterior of the semiconductor device A2, although each of these two leads 31 electrically connects, along with the wire 51 and the electroconductive bonding material 52, one of the first electrodes 13 of the first semiconductor element 1 and one of the second electrodes 23 of the second semiconductor element 2 to each other.

According to this embodiment again, while the first semiconductor element 1 and the second semiconductor element 2 are electrically connected to each other properly, size reduction of the semiconductor device A2 and increase of the amount of current that can flow through the device are realized.

Figure 8:
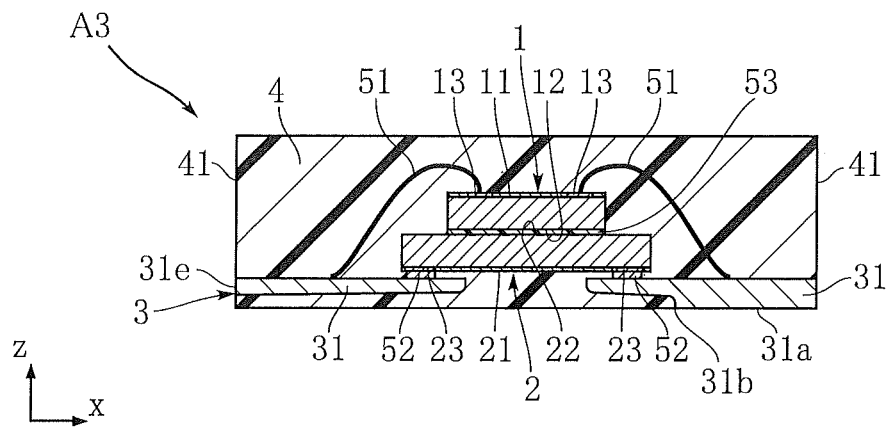
FIG. 8 is a sectional view of a semiconductor device according to a third embodiment.

FIG. 8 shows a semiconductor device according to a third embodiment. The structure of the semiconductor device A3 of this embodiment as viewed in plan is the same as that of the semiconductor device A1 shown in FIG. 1. FIG. 8 is a sectional view in a z-x plane, which corresponds to the sectional view taken along lines II-II in FIG. 1.

In the semiconductor device A3, at least one of the leads 31 (the left lead 31 in FIG. 8) has a structure that is different from the leads 31 of the semiconductor device A1. This lead 31 does not have a stepped portion 31b and the opposite sides of this lead in the thickness direction are covered with the resin package 4 throughout its length. Thus, the lead 31 does not have the mount surface 31a described in relation to the semiconductor device A1. This lead 31 has an exposed end surface 31e. The exposed end surface 31e is a surface exposed in the lateral direction from the resin package 4 and flush with the side surface 41 of the resin package 4.

The above-described lead 31 is intended to be completely insulated from the circuit board when the semiconductor device A3 is mounted on the circuit board. That is, the lead 31 does not constitute a conduction path to the exterior, although the lead 31 electrically connects, along with the wire 51 and the electroconductive bonding material 52, one of the first electrodes 13 of the first semiconductor element 1 and one of the second electrodes 23 of the second semiconductor element 2.

Figure 9:
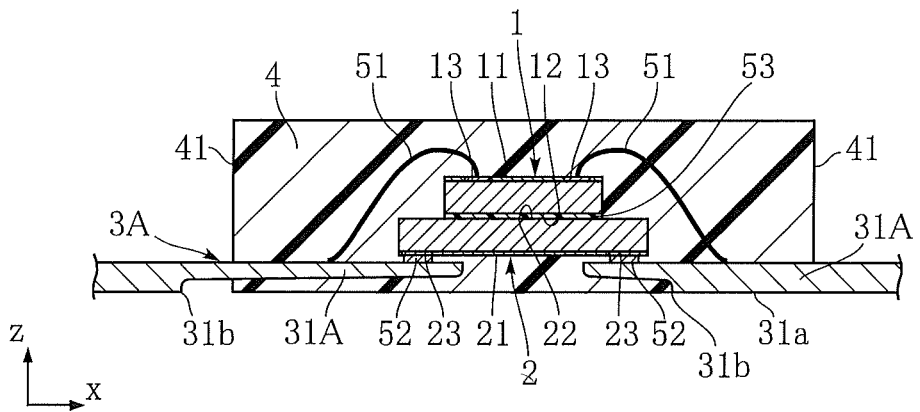
FIG. 9 is a sectional view showing a process step for making the semiconductor device of FIG. 8.

FIG. 9 shows an example of a process step for making the semiconductor device A3. The figure shows two leads 31A which are to become the leads 31. These leads 31A, along with non-illustrated other leads, form a lead frame 3A. The left lead 31A in the figure has a stepped portion 31b. The stepped portion 31b is provided outside the resin package 4. After the resin package 4 is formed, the lead 31A may be cut along the resin package 4, whereby the left lead 31 in FIG. 8 is formed.

According to this embodiment again, while the first semiconductor element 1 and the second semiconductor element 2 are electrically connected to each other properly, size reduction of the semiconductor device A3 and increase of the amount of current that can flow through the device are realized. Moreover, the left lead 31 in FIG. 8 does not include a portion exposed downward from the resin package 4. Thus, in mounting the semiconductor device A3 on e.g. a circuit board, the lead 31 is reliably insulated from a wiring pattern of the circuit board even when the wiring pattern is located directly under the lead 31.

Figure 10:
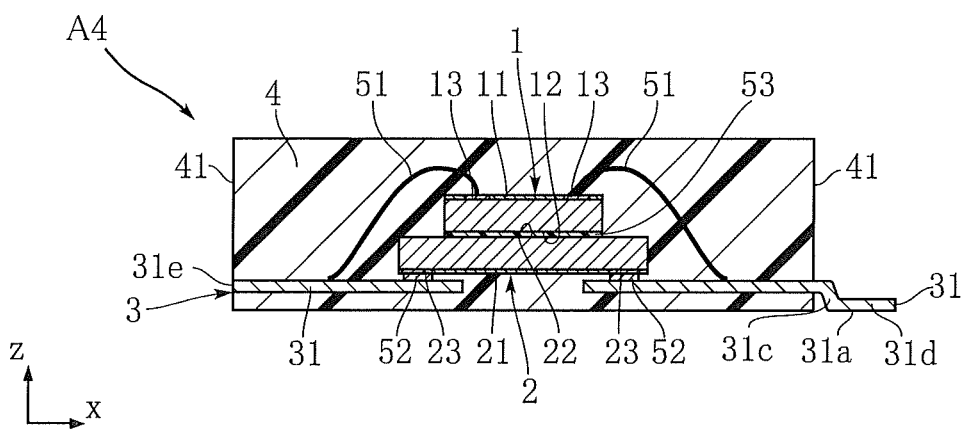
FIG. 10 is a sectional view of a semiconductor device according to a fourth embodiment.

FIG. 10 shows a semiconductor device according to a fourth embodiment. The structure of the semiconductor device A4 of this embodiment as viewed in plan is the same as that of the semiconductor device A2 shown in FIG. 5 except some portions. FIG. 10 is a sectional view in a z-x plane, which corresponds to the sectional view taken along lines VI-VI in FIG. 5.

In the semiconductor device A4, at least one of the leads 31 (the left lead 31 in FIG. 10) has a structure that is different from the leads 31 of the semiconductor device A2. This lead 31 does not have the projection 31d or the bent 31c and the opposite sides of this lead in the thickness direction are covered with the resin package 4 throughout its length. Thus, the lead 31 does not have the mount surface 31a described in relation to the semiconductor device A2. This lead 31 has an exposed end surface 31e. The exposed end surface 31e is a surface exposed in the lateral direction from the resin package 4 and flush with the side surface 41 of the resin package 4.

The above-described lead 31 is intended to become completely insulated from the circuit board when the semiconductor device A4 is mounted on the circuit board. That is, the lead does not constitute a conduction path to the exterior of the semiconductor device A3, although the lead 31 electrically connects, along with the wire 51 and the electroconductive bonding material 52, one of the first electrodes 13 of the first semiconductor element 1 and one of the second electrodes 23 of the second semiconductor element 2.

According to this embodiment again, while the first semiconductor element 1 and the second semiconductor element 2 are electrically connected to each other properly, size reduction of the semiconductor device A4 and increase of the amount of current that can flow through the device are realized. Moreover, the left lead 31 in FIG. 10 does not include a portion exposed downward from the resin package 4. Thus, in mounting the semiconductor device A4 on e.g. a circuit board, the lead 31 is reliably insulated from a wiring pattern of the circuit board even when the wiring pattern is located directly under the lead 31.

Figure 11:
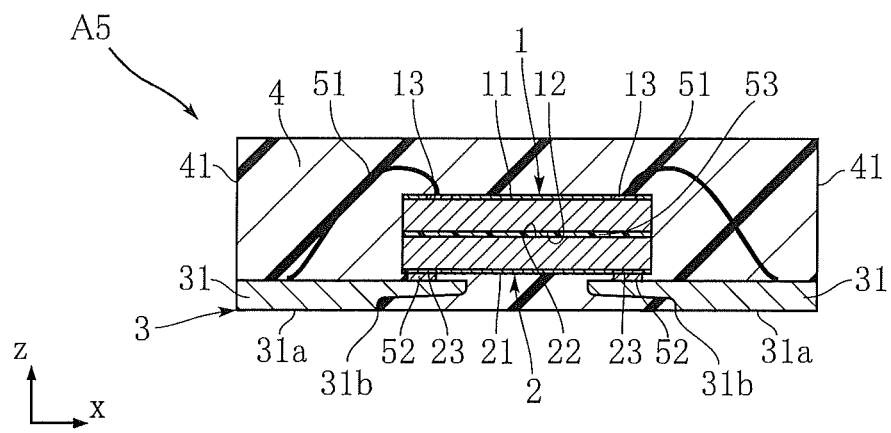
FIG. 11 is a sectional view of a semiconductor device according to a fifth embodiment.

FIG. 11 shows a semiconductor device according to a fifth embodiment. The structure of the semiconductor device A5 of this embodiment is the same as that of the semiconductor device A1 except the magnitude relation between the semiconductor element 1 and the semiconductor element 2. The magnitude relation between the semiconductor element 1 and the semiconductor element 2 described below can appropriately be applied to the above-described semiconductor devices A2, A3 and A4. FIG. 11 is a sectional view in a z-x plane, which corresponds to the sectional view taken along lines II-II in FIG. 1.

In this embodiment, the first semiconductor element 1 and the second semiconductor element 2 have the same dimensions as viewed in plan and are arranged in such a manner that the outer edges of the two semiconductor elements correspond to each other. Thus, no portion of the second semiconductor element 2 projects from the first semiconductor element 1. This arrangement in which the first semiconductor element 1 and the second semiconductor element 2 are identical as viewed in plan also allows the wires 51 to be properly bonded to first electrodes 13 of the first semiconductor element 1 and the electroconductive bonding materials 52 to be properly bonded to the second electrodes 23 of the second semiconductor element 2.

According to this embodiment again, while the first semiconductor element 1 and the second semiconductor element 2 are electrically connected to each other properly, size reduction of the semiconductor device A5 and increase of the amount of current that can flow through the device are realized. According to the structure in which the wires 51 are to be bonded to the first electrodes 13 of the first semiconductor element 1 and the electroconductive bonding materials 52 are to be bonded to the second electrodes 23 of the second semiconductor element 2, the first semiconductor element 1 and the second semiconductor element 2 can be properly stacked together to make the semiconductor device A6 even when the first semiconductor element 1 and the second semiconductor element 2 have the same size as viewed in plan. This is advantageous over the structure in which wires 51 are to be bonded to both of the first electrodes 13 of the first semiconductor element 1 and the second electrodes 23 of the second semiconductor element 2, which requires that the second semiconductor element 2 be larger than the first semiconductor element 1.

Figure 12:
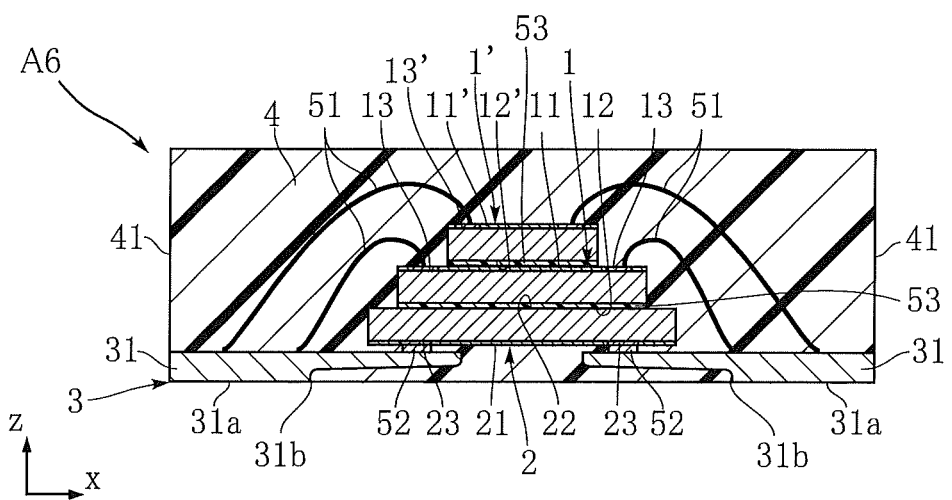
FIG. 12 is a sectional view of a semiconductor device according to a sixth embodiment.

FIG. 12 shows a semiconductor device according to a sixth embodiment. The semiconductor device A6 of this embodiment has the same structure as that of the semiconductor device A1 except that the semiconductor device of this embodiment further includes a third semiconductor element 1'. The structure including the third semiconductor element 1' described below can be appropriately applied to the above-described semiconductor devices A2, A3, A4 and A5. FIG. 5 is a sectional view in a z-x plane, which corresponds to the sectional view taken along lines II-II in FIG. 1.

In this embodiment, the semiconductor device A6 includes the third semiconductor element 1' in addition to the first semiconductor element 1 and the second semiconductor element 2. The third semiconductor element 1' is a functional element that performs at least a part of the function of the semiconductor device A6 and has a third active surface 11', a reverse surface 12' and a plurality of third electrodes 13'. The third semiconductor element 1' is made of e.g. Si and rectangular as viewed in plan in this embodiment.

A functional circuit for achieving the function of the third semiconductor element 1' is formed in the third active surface 11'. For easier understanding, it is supposed that the third active surface 11' is a region having a certain thickness as shown in FIG. 12. The third active surface 11' faces upward. The reverse surface 12' faces in the opposite direction from the third active surface 11', i.e., faces downward.

The third electrodes 13' are formed in the third active surface 11'. Each of the third electrodes 13' includes e.g. a part of an Au layer exposed from an insulating layer (not shown) or such a part of an Au layer on which a metal layer is formed.

In this embodiment, the third electrodes 13' are arranged along the four sides of the third semiconductor element 1' that is rectangular.

The third semiconductor element 1' is mounted on the first active surface 11 of the first semiconductor element 1 via e.g. an insulating bonding material 53. The third semiconductor element 1' is smaller than the first semiconductor element 1 and arranged to be contained in the first semiconductor element 1 as viewed in plan. Thus, the first electrodes 13 of the first semiconductor element 1 are not covered by the third semiconductor element 1' but exposed from the third semiconductor element 1'.

Wires 51 are bonded to the third electrodes 13'. These wires 51 are bonded to the leads 31, respectively, by extending over the wires 51 bonded to the first electrodes 13 of the first semiconductor element 1. With this arrangement, the first electrodes 13 of the first semiconductor element 1, the second electrodes 23 of the second semiconductor element 2, and the third electrodes 13' of the third semiconductor element 1' are electrically connected to each other via the leads 31.

According to this embodiment again, while the first semiconductor element 1 and the second semiconductor element 2 are electrically connected to each other properly, size reduction of the semiconductor device A6 and increase of the amount of current that can flow through the device are realized. As will be understood from this embodiment, the number of semiconductor elements to be mounted is not limitative in the semiconductor device according to the present invention.

FIGS. 13-16 show a semiconductor device according to a seventh embodiment. The semiconductor device A7 of this embodiment includes a first semiconductor element 1, a second semiconductor element 2, an electroconductive support member 3 and a resin package 4.

Figure 13:
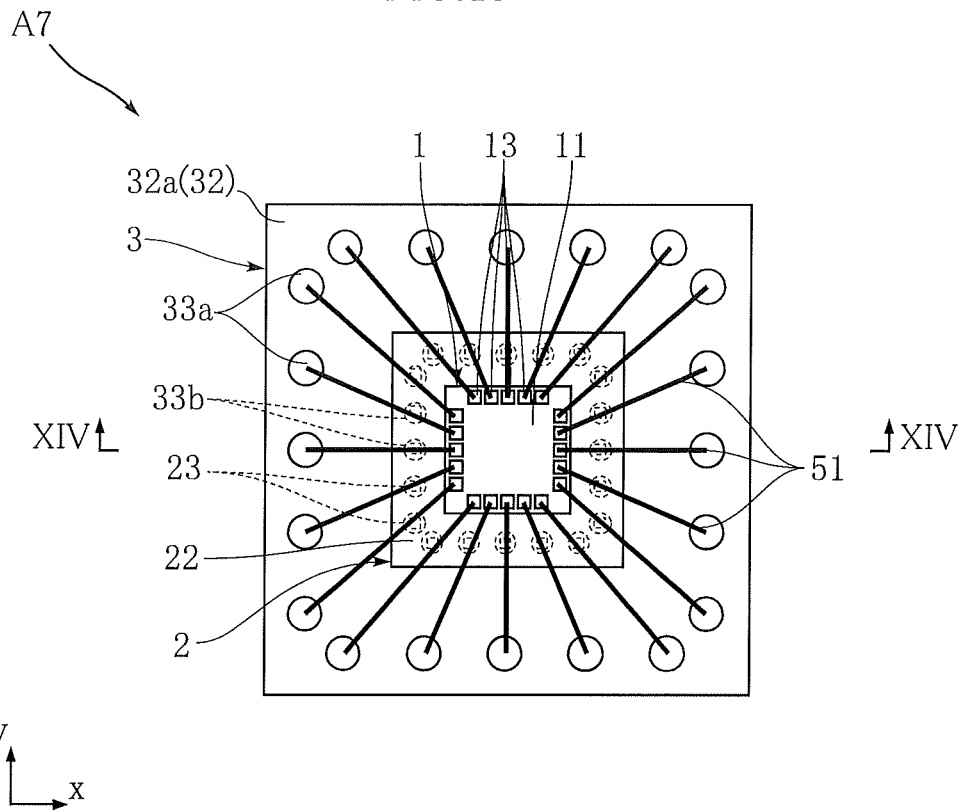
FIG. 13 is a schematic plan view of a semiconductor device according to a seventh embodiment.
Figure 14:
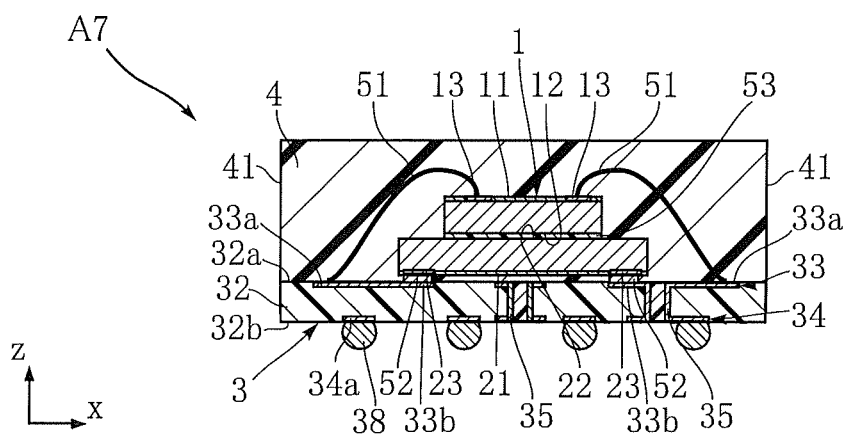
FIG. 14 is a sectional view taken along lines XIV-XIV in FIG. 13.
Figure 15:
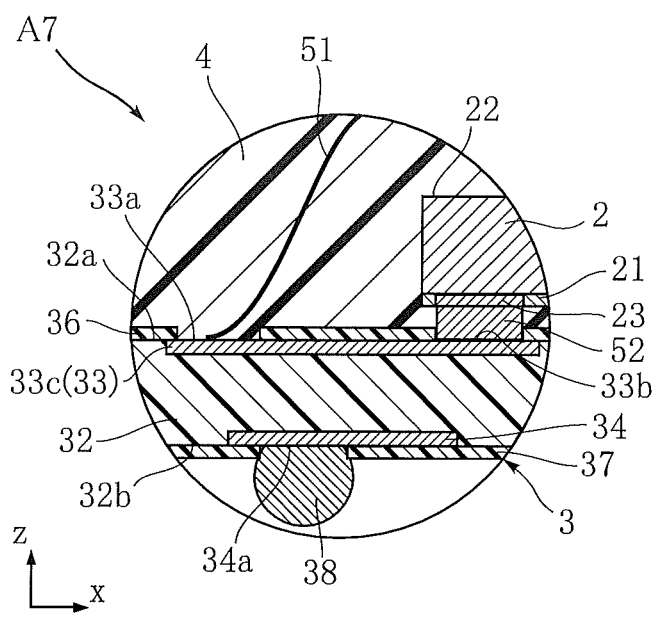
FIG. 15 is an enlarged sectional view of a part of the semiconductor device of FIG. 13.

FIG. 13 is a schematic plan view of the semiconductor device A7. FIG. 14 is a sectional view in a z-x plane, taken along lines XIV-XIV in FIG. 13. FIGS. 15 and 16 are schematic enlarged sectional views of a part of FIG. 14. In FIG. 13, illustration of the resin package 4 is omitted for easier understanding.

The first semiconductor element 1 is a functional element that performs at least a part of the function of the semiconductor device A7 and has a first active surface 11, a reverse surface and a plurality of first electrodes 13. The first semiconductor element 1 is made of e.g. Si and rectangular as viewed in plan in this embodiment.

A functional circuit for achieving the function of the first semiconductor element 1 is formed in the first active surface 11. For easier understanding, it is supposed that the first active surface 11 is a region having a certain thickness as shown in FIG. 14. The first active surface 11 faces upward in FIG. 14. The reverse surface 12 faces in the opposite direction from the first active surface 11, i.e., faces downward.

The first electrodes 13 are formed in the first active surface 11. Each of the first electrodes 13 includes e.g. a part of an Au layer exposed from an insulating layer (not shown) or such a part of an Au layer on which a metal layer is formed. In this embodiment, the first electrodes 13 are arranged along the four sides of the first semiconductor element 1 that is rectangular.

The second semiconductor element 2 is a functional element that performs at least a part of the function of the semiconductor device A7 and has a second active surface 21, a reverse surface and a plurality of second electrodes 23. The second semiconductor element 2 is made of e.g. Si and rectangular as viewed in plan in this embodiment.

A functional circuit for achieving the function of the second semiconductor element 2 is formed in the second active surface 21. For easier understanding, it is supposed that the second active surface 21 is a region having a certain thickness as shown in FIGS. 14-16. The second active surface 21 faces downward in FIGS. 14-16. The reverse surface 22 faces in the opposite direction from the second active surface 21, i.e., faces upward.

The second electrodes 23 are formed in the second active surface 21. Each of the second electrodes 23 includes e.g. a part of an Au layer exposed from an insulating layer (not shown) or such a part of an Au layer on which a metal layer is formed. In this embodiment, the second electrodes 23 are arranged along the four sides of the second semiconductor element 2 that is rectangular.

The first semiconductor element 1 is mounted on the second semiconductor element 2. In other words, the second semiconductor element 2 is positioned between the first semiconductor element 1 and the electroconductive support member 3 in the direction z. The first semiconductor element 1 and the second semiconductor element 2 are bonded to each other by using an insulating bonding material 53. More specifically, the reverse surface 12 of the first semiconductor element 1 and the second active surface 21 of the second semiconductor element 2 are bonded to each other by using the insulating bonding material 53. For instance, the insulating bonding material 53 may be an insulating die attach film or insulating paste. With this arrangement, the first active surface 11 of the first semiconductor element 1 and the second active surface 21 of the second semiconductor element 2 face in mutually opposite directions. In this embodiment, the first semiconductor element 1 is smaller than the second semiconductor element 2 in dimensions as viewed in plan, so that the entirety of the first semiconductor element 1 is contained in the second semiconductor element 2 as viewed in plan. In this embodiment, the second electrodes 23 are arranged outside the first semiconductor element 1 as viewed in plan.

The electroconductive support member 3 supports the first semiconductor element 1 and the second semiconductor element 2 directly or indirectly, and also constitutes a conduction path to the first semiconductor element 1 and the second semiconductor element 2. In this embodiment, the electroconductive support member 3 includes a base 32, a principal-side plating layer 33, a reverse-side plating layer 34, through-hole conductors 35, a principal-side resist layer 36, a reverse-side resist layer 37 and a plurality of solder balls 38. This electroconductive support member 3 is structured as a so-called BGA (Ball Grid Array) substrate and rectangular as viewed in plan in this embodiment.

The base 32 serves as a base of the electroconductive support member 3 as a BGA substrate and is a plate-like member made of an insulating material. The base 32 has a principal surface 32a and a reverse surface 32b. The principal surface 32a faces upward and is located adjacent to the second semiconductor element 2. The reverse surface 32b faces downward.

The principal-side plating layer 33 is formed on the principal surface 32a of the base 32 or very close to the principal surface 32a in the thickness direction and includes a plating layer of a metal such as Au or Cu. The principal-side plating layer 33 constitutes an electroconductive element. As shown in FIGS. 15 and 16, appropriate portions of the principal-side plating layer 33 are covered by the principal-side resist layer 36. The principal-side resist layer 36 is a layer made of e.g. an insulating resin and covers most parts of the principal-side plating layer 33 while leaving some parts exposed.

The portions of the principal-side plating layer 33 that are exposed from the principal-side resist layer 36 constitute a plurality of principal-side electrodes 33a and a plurality of principal-side electrodes 33b. The principal-side electrodes 33a are arranged on the outside of the second semiconductor element 2 as viewed in plan. The principal-side electrodes 33b are arranged to overlap the second semiconductor element 2. To the principal-side electrodes 33a are connected wires 51, which are electrically connected to the first electrodes 13 of the first semiconductor element 1. The principal-side electrodes 33b are arranged to overlap the second electrodes 23 of the second semiconductor element 2. The principal-side electrodes 33b and the second electrodes 23 are bonded to each other by a plurality of electroconductive bonding materials 52.

The reverse-side plating layer 34 is formed on the reverse surface 32b of the base 32 or very close to the reverse surface 32b in the thickness direction and includes a plating layer of a metal such as Au or Cu. The reverse-side plating layer 34 constitutes an electroconductive element. As shown in FIGS. 15 and 16, appropriate portions of the reverse-side plating layer 34 are covered by the reverse-side resist layer 37. The reverse-side resist layer 37 is a layer made of e.g. an insulating resin and covers most parts of the reverse-side plating layer 34 while leaving some parts exposed.

The portions of the reverse-side plating layer 34 which are exposed from the reverse-side resist layer 37 constitute a plurality of reverse-side electrodes 34a. In this embodiment, the reverse-side electrodes 34a are arranged in a matrix as viewed in plan. The reverse-side electrodes 34a are provided with solder balls 38. The solder balls 38 are formed so as to project from the reverse-side electrodes 34a and used for mounting the semiconductor device A7 on e.g. a circuit board.

The through-hole conductors 35 are conductor layers formed on the inner surfaces of the through-holes penetrating the base 32 and include plating layers of a metal such as Au or Cu, similarly to the principal-side plating layer 33 or the reverse-side plating layer 34. An appropriate number of through-hole conductors 35 are provided to electrically connect portions of the principal-side plating layer 33 and portions of the reverse-side plating layer 34. For instance, in the region shown in FIG. 16, the wire 51 and the electroconductive bonding material 52 are bonded to the illustrated principal-side electrode 33a and the illustrated principal-side electrode 33b, respectively. These principal-side electrode 33a and principal-side electrode 33b are electrically connected to the reverse-side electrode 34a of the reverse-side plating layer 34 via the through-hole conductor 35. Thus, the first electrode 13 to which the illustrated wire 51 is bonded and the second electrode 23 to which the illustrated electroconductive bonding material 52 is bonded are electrically connected to the same reverse-side electrode 34a and solder ball 38.

On the other hand, in the region illustrated in FIG. 15, the illustrated two principal-side electrodes 33a and 33b include a same portion of the principal-side plating layer 33 and hence are electrically connected to each other, but these two electrodes are not electrically connected to the through-hole conductor 35 and so on. Thus, these principal-side electrode 33a and principal-side electrode 33b are insulated from the reverse-side electrodes 34a or the solder ball 38. The portion of the principal-side plating layer 33 which constitutes these principal-side electrode 33a and principal-side electrode 33b is defined as an isolated element 33c. The isolated element 33c is a portion of the principal-side plating layer 33 which is isolated from other portions. Although the isolated element 33c is electrically connected to the first electrode 13 and the second electrode 23 via the wire 51 and the electroconductive bonding material 52, respectively, they do not constitute a conduction path to the exterior.

The resin package 4 entirely covers the first semiconductor element 1, the second semiconductor element 2 and the wires 51 for protection. The resin package 4 also covers at least a part of each lead 31 to hold the leads at appropriate positions and provide insulation between the leads. For instance, the resin package 4 is made of black epoxy resin. In this embodiment, the resin package 4 is rectangular as viewed in plan and has four side surfaces 41 that forms the rectangle.

According to this embodiment again, while the first semiconductor element 1 and the second semiconductor element 2 are electrically connected to each other properly, size reduction of the semiconductor device A7 and increase of the amount of current that can flow through the device are realized. Further, the electroconductive support member 3 configured as a BGA substrate allows the principal-side plating layer 33 and the reverse-side plating layer 34 to be arranged relatively freely and, in particular, allows the isolated element 33c to be arranged at a desired position. For instance, an isolated element 33c may be formed which electrically connects the first electrode 13 and the second electrode 23 spaced apart by a large distance as viewed in plan. Moreover, an isolated element that electrically functions similarly to the isolated element 33c may be provided by a part of the principal-side plating layer 33, a part of the reverse-side plating layer 34 and the through-hole conductor 35.

The semiconductor device and the electronic unit according to the present invention are not limited to the foregoing embodiments. The specific structure of each part of the semiconductor device and the electronic unit according to the present invention may be varied in design in many ways.

The invention claimed is:

1. A semiconductor device comprising:
   a first semiconductor element including a first active surface and a plurality of first electrodes formed on the first active surface;
   a second semiconductor element including a second active surface and a plurality of second electrodes formed on the second active surface;
   an electroconductive support member electrically connected to the first semiconductor element and the second semiconductor element while supporting the first semiconductor element and the second semiconductor element, the electroconductive support member including a plurality of electroconductive elements; and
   a resin package covering the first semiconductor element and the second semiconductor element;
   wherein the second semiconductor element is located between the first semiconductor element and the electroconductive support member,
   the semiconductor device further comprises: a wire connected to one of the first electrodes of the first semiconductor element and one of the electroconductive elements; and an electroconductive bonding material that bonds one of the second electrodes of the second semiconductor element and said one of the electroconductive elements to which the wire is bonded, and
   the electroconductive support member includes, as the electroconductive elements, a plurality of leads made of metal.

2. The semiconductor device according to claim 1, wherein the electroconductive elements includes at least one electroconductive element to which a wire is connected and an electroconductive bonding material is bonded but which is not connected to an external object.

3. The semiconductor device according to claim 1, wherein the first active surface of the first semiconductor element faces away from the electroconductive support member, and the second active surface of the second semiconductor element faces toward the electroconductive support member.

4. The semiconductor device according to claim 1, wherein the resin package is rectangular as viewed in plan, and the leads extend inward from each of four sides of the resin package.

5. The semiconductor device according to claim 1, wherein each of the leads is flat on a side closer to the second semiconductor element, and said each lead has a portion that is covered with the resin package on opposite sides in a thickness direction thereof.

6. The semiconductor device according to claim 5, wherein said each lead has a portion that is exposed from the resin package on a side opposite from the second semiconductor element in the thickness direction.

7. The semiconductor device according to claim 5, wherein said each lead has a stepped portion on a side opposite from the second semiconductor element to provide a mount surface exposed from the resin package on the side opposite from the second semiconductor element.

8. The semiconductor device according to claim 1, wherein each of the leads has a uniform thickness and a portion that is covered with the resin package on opposite sides in a thickness direction thereof.

9. The semiconductor device according to claim 8, wherein said each lead includes a projection projecting laterally from the resin package.

10. The semiconductor device according to claim 9, wherein said each lead is formed with a bent at the projection to provide a mount surface.

11. The semiconductor device according to claim 1, wherein at least one of the leads, to which a wire and an electroconductive bonding material are bonded, is covered with the resin package throughout a length thereof on opposite sides in the thickness direction and includes an end surface that is exposed from the resin package and flush with a side surface of the resin package.

12. The semiconductor device according to claim 1, wherein, as viewed in plan, at least one of the second electrodes is located outside the first semiconductor element.

13. The semiconductor device according to claim 12, wherein, as viewed in plan, all of the second electrodes are located outside the first semiconductor element.

14. The semiconductor device according to claim 1, wherein the first semiconductor element and the second semiconductor element are bonded to each other by an insulating bonding material.

15. The semiconductor device according to claim 1, wherein, as viewed in plan, the first semiconductor element has a same size as that of the second semiconductor element or smaller than the second semiconductor element.

16. An electronic unit comprising:
a circuit board including a wiring pattern, and
a semiconductor device as set forth in claim 1,
wherein the semiconductor device is mounted on the circuit board, and
at least one of the electroconductive elements is electrically connected to a wire and an electroconductive bonding material and insulated from the wiring pattern of the circuit board.

* * * * *